(12) United States Patent
Mekias (10) Patent No.: US 11,499,855 B2
(45) Date of Patent: Nov. 15, 2022

(54) APPARATUS FOR MEASURING A FLUID FLOW THROUGH A PIPE OF A SEMICONDUCTOR MANUFACTURING DEVICE

(71) Applicant: SUSS MicroTec Lithography GmbH, Garching (DE)

(72) Inventor: Kader Mekias, Garching (DE)

(73) Assignee: SUSS MICROTEC LITHOGRAPHY GMBH

( * ) Notice: Subject to any disclaimer, the term of this patent is extended or adjusted under 35 U.S.C. 154(b) by 476 days.

(21) Appl. No.: 16/702,214

(22) Filed: Dec. 3, 2019

(65) Prior Publication Data

US 2020/0173825 A1    Jun. 4, 2020

(30) Foreign Application Priority Data

Dec. 3, 2018  (NL) ...................................... 2022125

(51) Int. Cl.
*G01F 1/684* (2006.01)
*F16K 31/126* (2006.01)
*H01L 21/67* (2006.01)

(52) U.S. Cl.
CPC .......... *G01F 1/6847* (2013.01); *F16K 31/126* (2013.01); *H01L 21/67017* (2013.01)

(58) Field of Classification Search
CPC . G01F 1/6847; H01L 21/67017; F16K 31/126
USPC ......................................................... 285/45
See application file for complete search history.

(56) References Cited

U.S. PATENT DOCUMENTS

| | | | |
|---|---|---|---|
| 2,942,465 A | 6/1960 | Carbone et al. | ................ 73/211 |
| 3,600,945 A | 8/1971 | Wenzel et al. | .................. 73/205 |
| 4,015,473 A | 4/1977 | Kleuters et al. | ............ 73/205 L |
| 4,592,239 A | 6/1986 | Cutler | ........................ 73/861.66 |
| 4,884,460 A | 12/1989 | Nowacki et al. | .......... 73/861.52 |
| 5,038,621 A | 8/1991 | Stupecky | ................... 73/861.53 |
| 5,979,247 A | 11/1999 | Kizawa | ..................... 73/861.53 |
| 6,164,142 A | 12/2000 | Dimeff | ...................... 73/861.61 |
| 6,311,568 B1 * | 11/2001 | Kleven | ..................... G01F 1/42 |
| | | | 73/861.42 |
| 6,324,917 B1 | 12/2001 | Mack et al. | ............... 73/861.52 |

(Continued)

FOREIGN PATENT DOCUMENTS

| | | | | |
|---|---|---|---|---|
| CA | 1069342 | * | 1/1980 | .............. G01F 1/22 |
| CN | 203349877 | | 12/2013 | .............. G01F 1/42 |

(Continued)

*Primary Examiner* — Nathaniel T Woodward
(74) *Attorney, Agent, or Firm* — Hayes Soloway P.C.

(57) ABSTRACT

Disclosed is an apparatus for measuring a fluid flow through a pipe of a semiconductor manufacturing device, in particular a coater or a bonder. The apparatus includes a sealing structure arranged in the pipe, a flow structure having a fluid inlet arranged upstream of the sealing structure and a fluid outlet arranged downstream of the sealing structure, a first chamber arranged in the pipe upstream of the sealing structure, and a second chamber arranged in the pipe downstream of the sealing structure, and a measuring device, wherein the measuring device is adapted to measure a first fluid pressure in the first chamber and a second fluid pressure in the second chamber, wherein the measuring device is configured to determine the fluid flow based on the first and second fluid pressure.

19 Claims, 6 Drawing Sheets

(56) References Cited

U.S. PATENT DOCUMENTS

| | | | |
|---|---|---|---|
| 6,591,695 B1 | 7/2003 | Brookshire et al. | 73/861.61 |
| 6,622,573 B2* | 9/2003 | Kleven | G01F 1/42 |
| | | | 73/861.42 |
| 2002/0040607 A1* | 4/2002 | Kleven | G01F 1/42 |
| | | | 73/861.52 |
| 2004/0083820 A1 | 5/2004 | Ciobanu et al. | G01F 1/37 |
| 2007/0157738 A1 | 7/2007 | Hughes et al. | G01F 1/37 |
| 2008/0307896 A1* | 12/2008 | Ifft | G01F 1/42 |
| | | | 73/861.61 |
| 2009/0293636 A1 | 12/2009 | Uchiyama et al. | 73/861.61 |
| 2016/0103003 A1* | 4/2016 | Hering | G01F 1/42 |
| | | | 73/861.61 |

FOREIGN PATENT DOCUMENTS

| | | | |
|---|---|---|---|
| DE | 1 773 337 | 4/1971 | |
| DE | 27 23 337 | 2/1978 | G01F 1/26 |
| DE | 10 2004 019 519 | 11/2005 | G01F 1/40 |
| DE | 10 2009 022 742 | 3/2010 | G01F 1/36 |
| EP | 3 204 734 | 12/2020 | G01F 1/42 |
| WO | WO2016057366 | 4/2016 | G01F 1/42 |

\* cited by examiner

APPARATUS FOR MEASURING A FLUID FLOW THROUGH A PIPE OF A SEMICONDUCTOR MANUFACTURING DEVICE

BACKGROUND OF THE INVENTION

Generally, the present invention relates to a measurement technology for measuring fluid flows in pipes of semiconductor manufacturing devices. In particular, the invention relates to an apparatus for measuring a fluid flow in a pipe and to a semiconductor manufacturing device comprising such an apparatus.

Semiconductor processing machines, such as coaters or bonders, use various chemicals in order to treat surfaces of substrates, such as semiconductor wafers. The wafer treatment often generates fluid waste, for instance contaminated air, in a process chamber of such a machine. The fluid waste is usually removed from the process chamber via special pipes which are connected to the process chamber and serve as process exhaust ducts.

As a means of guaranteeing an optimal wafer treatment the fluid flow through such pipes can be monitored. An unexpected flow change, for example, is an indication of a process disturbance.

Flow meters are typically used to measure the fluid flow through such exhaust pipes. The flow meters are usually differential pressure flow meters, which measure the pressure difference of a fluid in the pipe upstream and downstream of a constriction of the pipe. The fluid flow can then be determined from difference between both pressures.

The fluid in these pipes can be contaminated with various process materials, such as solids, corrosive liquids, pastes or gels, which complicates the flow measurement. The contamination, for instance, obstruct pressure measurement ports of the flow meter leading to noisy signal readings.

Furthermore, turbulences in the fluid can lead to pressure variations at the pressure sensors, which causes additional measurement complications. In particular, these turbulences occur shorty before and after the constriction of the pipe, where the pressure measurements are usually performed.

Noisy signal readings due to turbulence or loss of signal due to contamination can disturb the control system of the flow meter. This control system stabilizes the flow level readings and hence allows a quieter control.

It is the object of the invention to provide an apparatus for efficiently measuring a fluid flow in a pipe, wherein the negative influence of turbulences and/or contaminations of the fluid on the measurement is reduced.

SUMMARY OF THE INVENTION

According to a first aspect, the invention relates to an apparatus for measuring a fluid flow through a pipe of a semiconductor manufacturing device, comprising a sealing structure which is arranged in the pipe, a flow structure having a fluid inlet which is arranged upstream of the sealing structure and a fluid outlet which is arranged downstream of the sealing structure, a first chamber which is arranged in the pipe upstream of the sealing structure, and a second chamber which is arranged in the pipe downstream of the sealing structure, and a measuring device, wherein the measuring device is adapted to measure a first fluid pressure in the first chamber and a second fluid pressure in the second chamber, wherein the measuring device is configured to determine the fluid flow based on the first and second fluid pressure. This achieves the advantage that the fluid flow in the pipe can be determined undisturbed by turbulences and/or fluid contaminations in the pipe. Since the pressure measurement are carried out in the chambers, the effect of such turbulences can be minimized.

The apparatus can form a flow meter, in particular a differential pressure flowmeter. The measured fluid flow can be a flow rate of the fluid in the pipe. The fluid flow is, for instance, measured in liters per minute.

The flow structure forms a restriction of the pipe, which the fluid has to pass through in order to get past the sealing structure. This causes a pressure increase in-front of the fluid inlet and in the first chamber, and a pressure decrease behind the fluid outlet and in the second chamber. The fluid flow is determined based on comparative pressure measurements of the different fluid pressures in both chambers.

Turbulences of the fluid and fluid contaminations will be strongest before the fluid inlet and after the fluid outlet of the flow structure. The fluid in the chambers is, however, shielded from these turbulences and contaminations, such that the influence of these disturbances on the measurement signal is strongly reduced.

The fluid can be of gaseous and/or liquid form. The fluid is, for instance, contaminated air. The contamination can comprise solids, corrosive liquids, pastes or gels. The fluid can have temperatures of up to 500° C. The temperature limit depends on the construction materials of the apparatus, which are, for instance, plastics.

The pipe can be a discharge line or an exhaust duct of a process chamber. The process chamber can be arranged in a semiconductor processing machine, for instance a coater or a bonder. A semiconductor substrate can be chemically treated in the process chamber giving rise to contaminated fluids, which are discharged from the process chamber through the pipe.

The pipe can be made of a metal, such as copper, stainless steel or aluminum, or of a synthetic material, such as PVC. The pipe can be a galvanized pipe.

According to an embodiment, the flow structure extends within the pipe. This achieves the advantage of a compact design of the apparatus.

The flow structure can be a tube with a smaller diameter than the pipe, wherein the tube extends within the pipe.

It is also conceivable that the flow structure is a separate tube that bypasses the sealing structure.

According to an embodiment, the flow structure comprises a plurality of tubes, in particular flow straightener tubes. This achieves the advantage of reducing the turbulence of the fluid that passes through the flow structure.

According to an embodiment, the tubes are formed by through holes in the sealing structure. This achieves the advantage of a compact design of the apparatus.

According to an embodiment, the sealing structure is a sealed barrier, in particular a plug. This achieves the advantage of an effective sealing of the pipe, such that the fluid can only pass the sealing structure through the flow structure.

According to an embodiment, the first chamber and/or the second chamber are connected to the sealing structure. This achieves the advantage of a compact design of the apparatus.

According to an embodiment the first chamber and the second chamber each have an opening to allow the fluid to flow into the first respectively second chamber. This achieves the advantage that the fluid pressure in the chambers adjusts to the fluid pressures in the pipe at the respective locations, allowing for an accurate pressure measurement, and hence flow measurements.

According to an embodiment the first chamber and/or the second chamber are conically shaped. This achieves the advantage to further reduce turbulence in the pipe.

According to an embodiment the first chamber and/or the second chamber are arranged coaxially to the sealing structure. This achieves the advantage to further reduce turbulence in the pipe.

According to an embodiment the measuring device is connected to the first and second chamber via fluid connections, such as fluid lines, and/or pressure connections, such as pressure ports or pressure lines, to measure the first and second fluid pressure. This achieves the advantage that the fluid pressure within the chambers can be accurately measured.

According to an embodiment, the measuring device comprises at least one pressure sensor element for measuring the first fluid pressure and the second fluid pressure. This achieves the advantage that the fluid pressures at the pressure ports can be efficiently determined.

The measuring device can have a single pressure sensor element that alternately measures the pressure in the chambers, or two pressure sensor elements, wherein in each case one sensor element is assigned to one chamber.

According to an embodiment, the measuring device comprises a processing unit, which is configured to determine the fluid flow based on a pressure difference between the first and second fluid pressure. This achieves the advantage that the fluid flow can be efficiently determined.

The processing unit can be a control unit of the apparatus. The processing unit can be connected to the measuring device to receive the first and second fluid pressure.

According to an embodiment, the apparatus comprises a flow regulator, in particular a flap or a turbine, which is arranged within the pipe, wherein the flow regulator can be adjusted to control the fluid flow. This achieves the advantage that the flow rate in the pipe can be actively regulated.

According to an embodiment, the measuring device, in particular the processing unit, is configured to control the flow regulator based on the determined fluid flow.

According to a second aspect, the invention relates to a semiconductor manufacturing device, in particular a coater or a bonder, comprising a pipe and an apparatus for measuring a fluid flow through the pipe according to the first aspect of the invention. This achieves the advantage that the fluid flow in the pipe can be determined undisturbed by turbulences and/or fluid contaminations.

According to an embodiment the pipe is a discharge line for contaminated fluids. The discharge line can start from a process chamber of the semiconductor manufacturing device.

BRIEF DESCRIPTION OF THE DRAWINGS

Further embodiments of the invention will be described with respect to the following figures, in which.

DETAILED DESCRIPTION OF THE DRAWINGS

Figure 1:
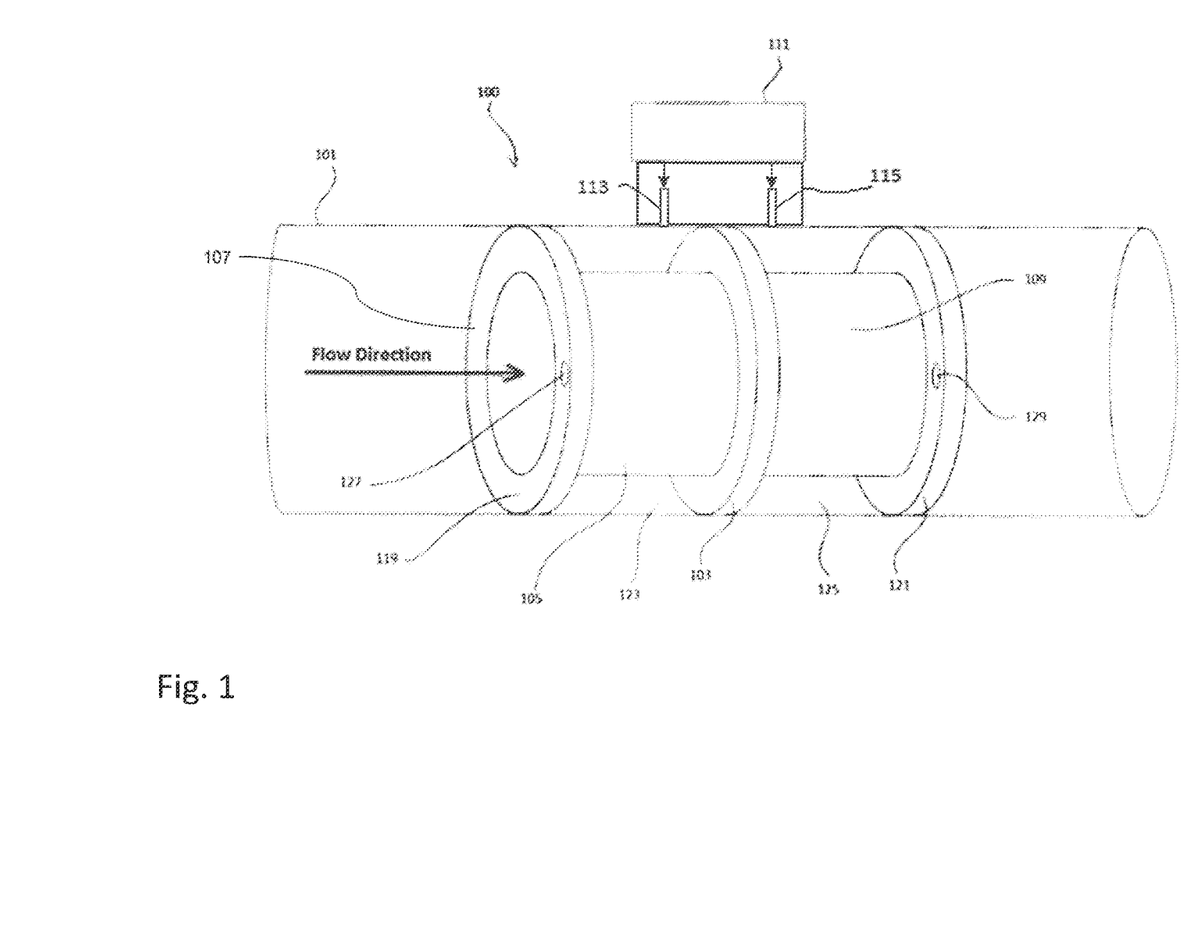
FIG. 1 shows a schematic view of an apparatus for measuring a fluid flow through a pipe.

FIG. 1. Shows a schematic view of an apparatus 100 for measuring a fluid flow through a pipe 101 according to an embodiment.

The apparatus 100 comprises a sealing structure 103 which is arranged in the pipe 101, a flow structure 105 having a fluid inlet 107 which is arranged upstream of the sealing structure 103 and a fluid outlet 109 which is arranged downstream of the sealing structure 103, a first chamber 123 which is arranged in the pipe 101 upstream of the sealing structure 103, and a second chamber 125 which is arranged in the pipe 101 downstream of the sealing structure 103.

The apparatus 100 further comprises a measuring device 111, wherein the measuring device 111 is adapted to measure a first fluid pressure in the first chamber 123 and a second fluid pressure in the second chamber 125, wherein the measuring device 111 is configured to determine the fluid flow based on the first and second fluid pressure.

The flow structure 105 is a single tube that extends within the pipe 101 and pierces through the sealing structure 103. The flow structure 105 has a lower diameter than the pipe 101 and therefore forms a restriction respectively constriction in the pipe that the fluid has to pass through in order to get past the sealing structure 103.

The diameter of the flow structure 105 can be less than 75% of the diameter of the pipe, preferably the diameter of the flow structure 105 is less than 50% of the diameter of the pipe 101, more preferably the diameter of the flow structure 105 is less than 25% of the diameter of the pipe. The flow structure 105 is sized to correspond to the flow range of the system and the differential pressure sensor range.

Thereby, the flow structure 105 can have a length of at least 2 cm, in particularly a length of at least 5 cm.

The fact that the flow structure 105 has a lower diameter than the pipe 101 causes a pressure increase of the fluid in-front of the fluid inlet 107 and a pressure decrease of the fluid behind the fluid outlet 109. The increased fluid pressure at the fluid inlet 107 spreads into the first chamber 123 and the decreased fluid pressure at the fluid outlet 109 spreads into the second chamber 125.

Therefore, the first chamber 123 is a high pressure chamber, and the second chamber 125 is a low pressure chamber. The sealing structure 103 prevents a pressure equalization between both chambers 123, 125.

The measuring device 111 comprises at least one pressure sensor element configured to measure the fluid pressure in each chamber. The measuring device 111 then determines the flow rate of the fluid based on the measured pressure difference. In particular, the apparatus 100 is a differential pressure flowmeter that uses Bernoulli's equation to determine the flow of fluid based on the pressure measurements.

In order to measure the first fluid pressure and the second fluid pressure the measuring device 111 is connected to the first chamber 123 and the second chamber 125 via two pressure ports 113, 115 that are arranged at a side wall of the pipe 101.

The pressure ports 113, 115 can comprise pressure port adapters or pressure joints that are fixed to the pipe 101 and that pass on the fluid pressure at each port 113, 115 to the pressure sensor element (or multiple pressure sensor elements) of the measuring device 111.

Both pressure ports 113, 115 can each comprise a valve, such that the first pressure port 113 acts as a high pressure tab and the second pressure port 115 acts as a low pressure tap.

The apparatus 100 in FIG. 1 further comprises a first seal 119 upstream of the sealing structure 103 and a second seal 121 downstream of the sealing structure. The first chamber 123 is formed in the pipe 101 between the first seal 119 and the sealing structure 103 and the second chamber 125 is formed in the pipe 101 between the sealing structure 103 and second seal 121.

The flow structure 105 pierces through the first seal 119 and the second seal 121, allowing fluid from upstream the first chamber 123 to flow into fluid inlet 107 and back into the pipe 101 through the fluid outlet 109 downstream of the second chamber 125.

The first and second seal 119, 121 both have an opening 127, 129 allowing the fluid from upstream the first seal 119 respectively downstream the second seal 121 to flow into the first respectively second chamber 123, 125.

The first seal 119 can be arranged approximately at the level of the fluid inlet 107 or shortly behind the fluid inlet 107. Equivalently, the second seal 121 can be arranged approximately at the level of the fluid outlet 109 or shortly before the fluid outlet 109. Hence, the fluid in the chambers will have an equal or similar pressure than the fluid in front of the fluid inlet 107 respectively behind the fluid outlet 109.

The flow structure 105 forms a constriction for the fluids, which can cause fluid turbulences at the fluid inlet 107 and/or outlet 109. These turbulences cause pressure fluctuations which can disturbed the pressure measurement, leading, for instance, to high measurement noise. In addition, fluid contamination can gather at the fluid inlet 107 and/or outlet 109, causing additional disturbances. The chambers 123, 125 protect the pressure measurements against these turbulences and contaminations of the fluid, allowing an undisturbed and noise free measurement of the fluid pressure and flow rate. Thereby, the chambers act as capacitance to smooth out the measurement signal.

The chambers 123, 125 can both comprise a filter or thin diaphragm to prevent contaminations to affect the pressure measurements. The filter or diaphragm can be located at the openings 127, 129, or inside the chambers 123, 125.

Figure 2:
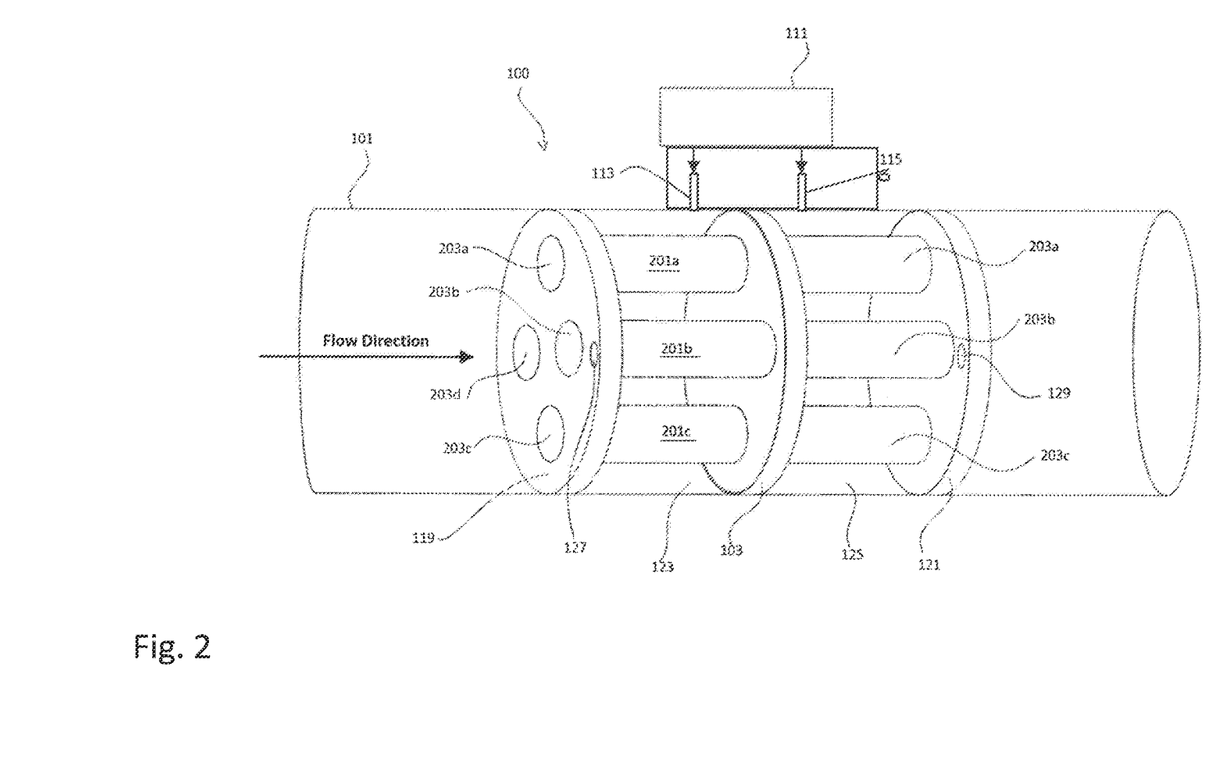
FIG. 2 shows a schematic view of an apparatus for measuring a fluid flow through a pipe according to an alternative embodiment.

FIG. 2 shows a schematic view of an apparatus 100 for measuring a fluid flow through a pipe 101 according to an alternative embodiment.

The flow structure 105 in FIG. 2 comprises a plurality of tubes 201a-d which are arranged side by side in the pipe 101.

Each tube has a fluid inlet 203a-d and a fluid outlet 205ad. The tubes 201a-d are arranged to form a flow straightener for the fluids, thus reducing fluid turbulences at the inlets 203a-d and/or outlets 205a-d FIG. 3 shows a schematic view of an apparatus 100 for measuring a fluid flow through a pipe 101 according to an embodiment.

Figure 3:
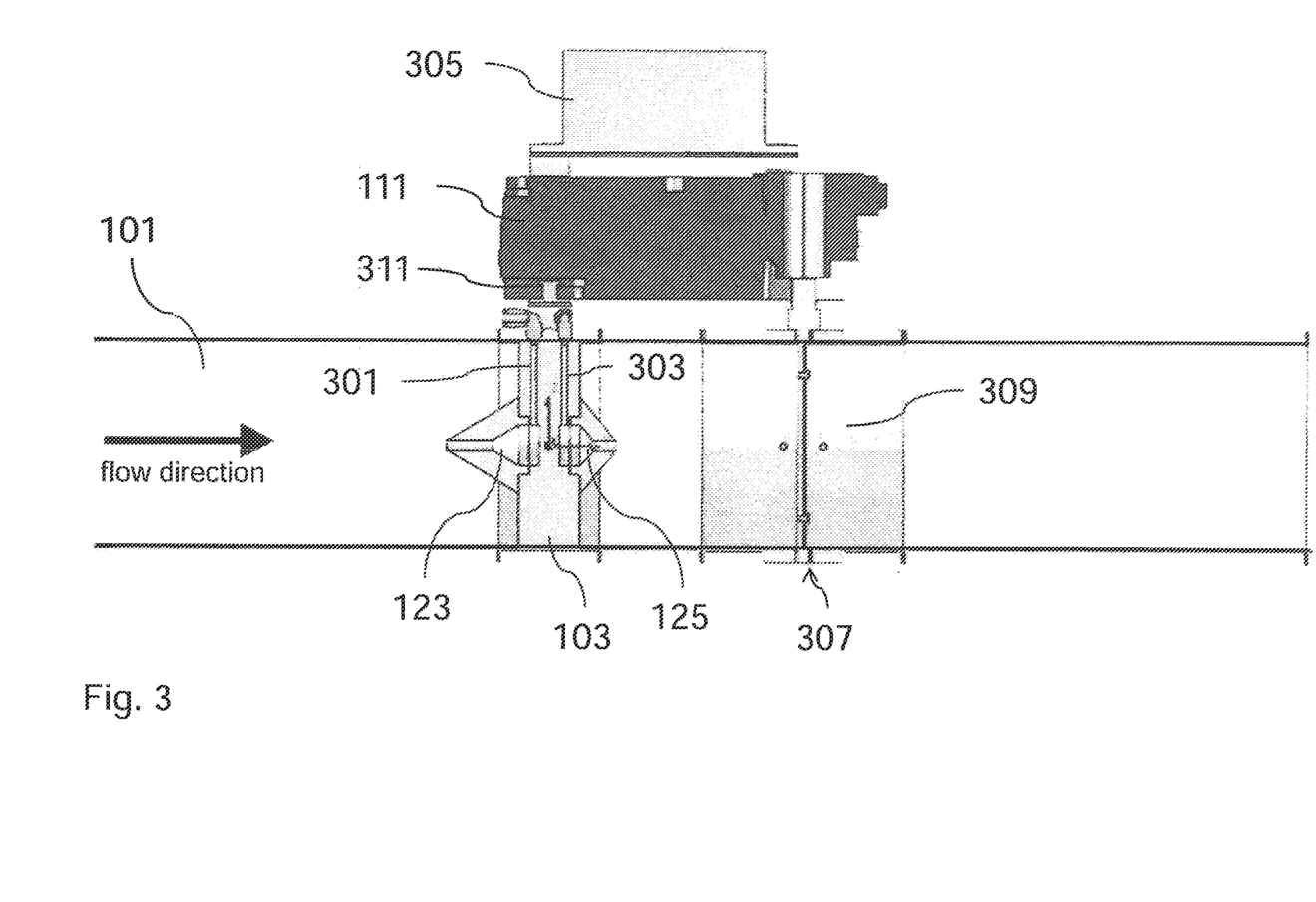
FIG. 3 shows a schematic view of an apparatus for measuring a fluid flow through a pipe according to an alternative embodiment.

The chambers 123, 125 of the apparatus 100 in FIG. 3 are conically shaped and located at the central sealing structure 103. Thereby, the chambers have a smaller diameter than the pipe 101, i.e. they do not fill out the pipe 101 entirely. The shape and position of the chambers 123,125 further reduces the generation of turbulences in the pipe.

The measuring device 111 in FIG. 3 comprises a pressure sensor element 311 for measuring the first and second fluid pressure.

The pressure connection between both chambers 123, 125 and the pressure sensor element 311 is partially realized via two fluid lines 301, 303. The fluid lines 301, 303 are channels in the sealing structure 103.

FIG. 3 further shows a control unit 305 that is connected to the measuring device 111. The control unit receives the fluid pressure values from the measuring device 111 and calculates the fluid flow rate based on these values.

The control unit 305 can be processing unit or comprise a processing unit that receives the pressure values and performs the calculation.

The apparatus 100 in FIG. 3 further comprises a flow regulator 309 which is located downstream of the sealing structure 103.

Figure 4:
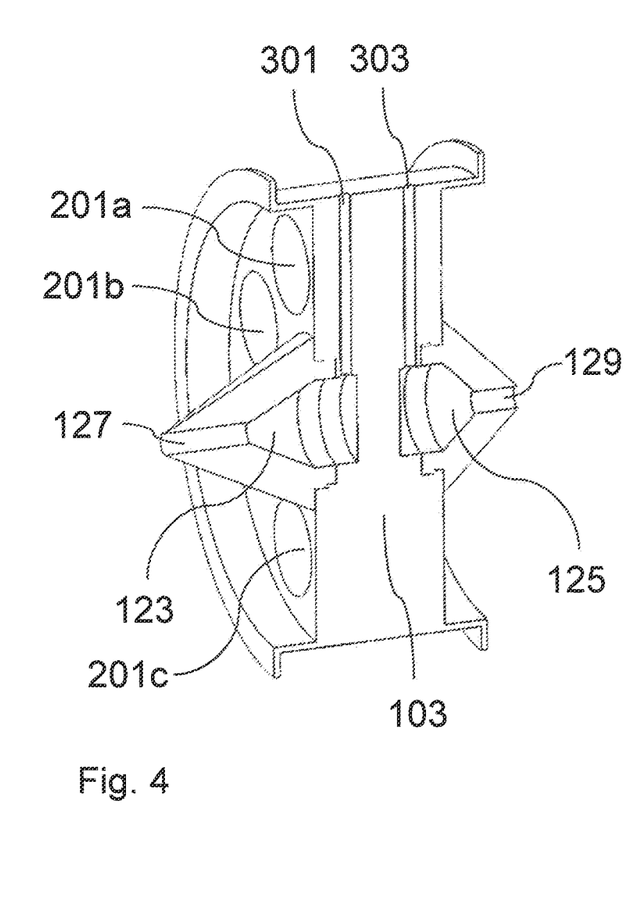
FIG. 4 shows a cross section view of a sealing element of the apparatus from FIG. 3.

FIG. 4 shows a cross section view of a sealing structure 103 of the apparatus 100 from FIG. 3 according to an embodiment.

In the exemplary embodiment shown in FIG. 4, the sealing structure 103, the flow structure 105 and the chambers 123, 125 form a single component of the apparatus 100.

Similar to the apparatus 100 shown in FIG. 2, the flow structure 105 in FIG. 4 comprises a plurality of tubes 201a-c which are formed as through holes in the sealing structure 103. In this arrangement the tubes 201a-c form a flow straightener structure that further reduces turbulences in the pipe 101.

The tubes 201a-c and the chambers 123, 125 are arranged coaxially to achieve a steady through flow of the fluid.

FIG. 4 further shows, that the opening 127, 129 of the conical shaped chambers 123, 125 can be positioned at the respective tips of the chamber cones.

Figure 5:
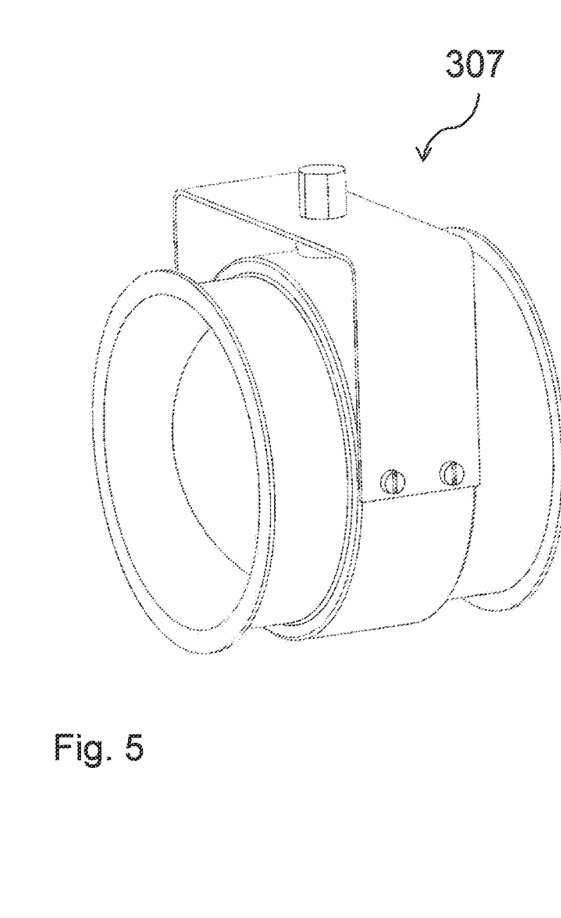
FIG. 5 shows a schematic view of a flow regulator of the apparatus from FIG. 3.

FIG. 5 shows a schematic view of a flow regulator of the apparatus from FIG. 3 according to an embodiment.

The flow regulator 309 can comprise a flap which can fully or partially block the fluid flow. Alternatively the flow regulator can comprise a turbine which can increase the fluid flow.

The flow regulator 309 can be connected to the control unit 305 of the apparatus 100. The control unit 305 can receive the determined flow rate of the fluid and control the flow regulator based on this value.

If, for instance, the control unit 305 determines that the flow rate exceeds a predetermined range, than the control unit 305 controls the flow regulator 309 to reduce the fluid flow, e.g. by closing a flap of the flow regulator. The control of the flow regulator 309 can be realized by a PID control loop.

Figure 6:
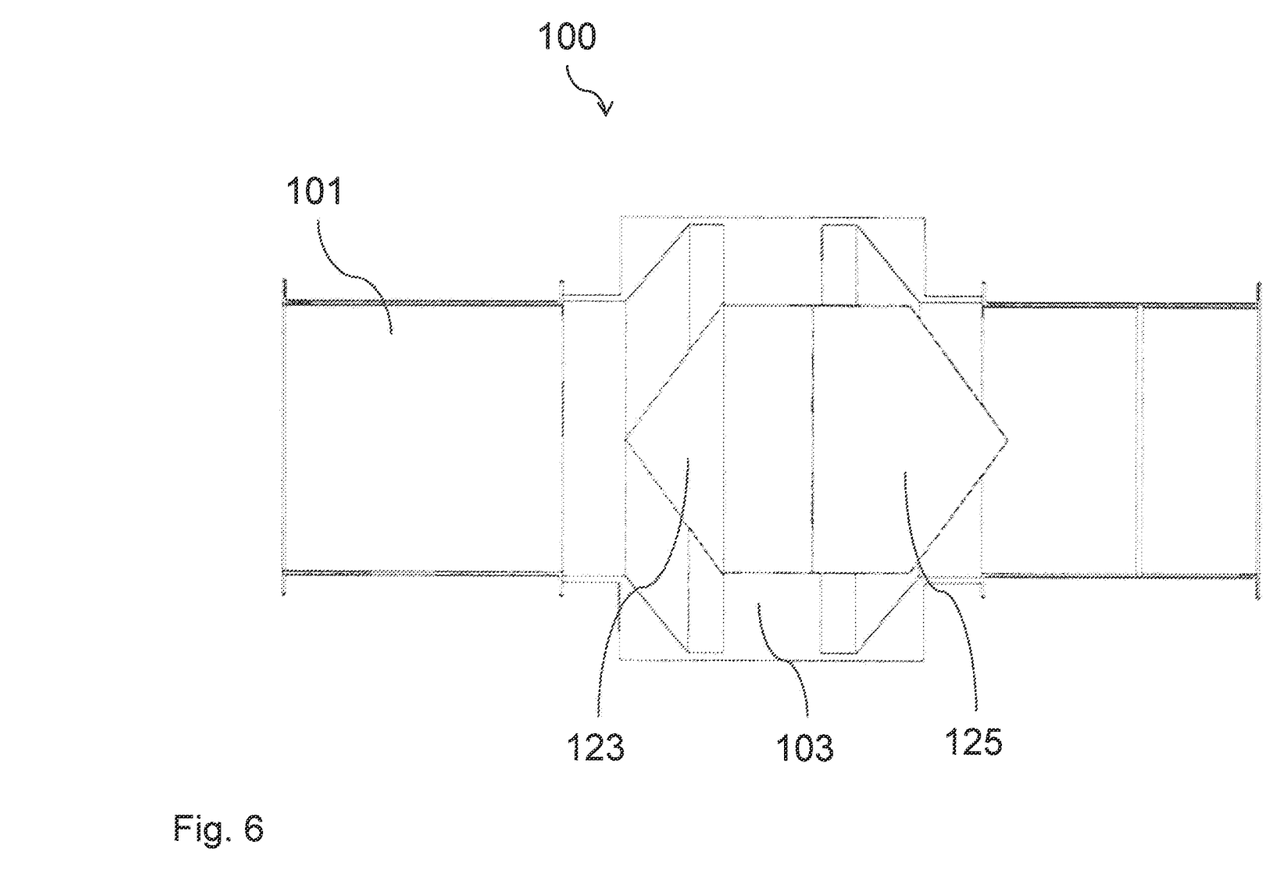
FIG. 6 shows a schematic view of an apparatus for measuring a fluid flow through a pipe.

FIG. 6 shows a schematic view of an apparatus 100 for measuring a fluid flow through a pipe 101 according to an embodiment.

In the design shown in FIG. 6, the sealing structure 103 has a larger diameter than the pipe 100, which is connected to the sealing structure 103 on both end. The chambers 123, 125 form a part of the sealing structure are surrounded by the flow straightener tubes (not shown).

Thereby the sealing structure 103, the chambers 123, 125 and the flow structure 105 form a single component of the apparatus 100 to which the pipe 101 can be connected.

Figure 7:
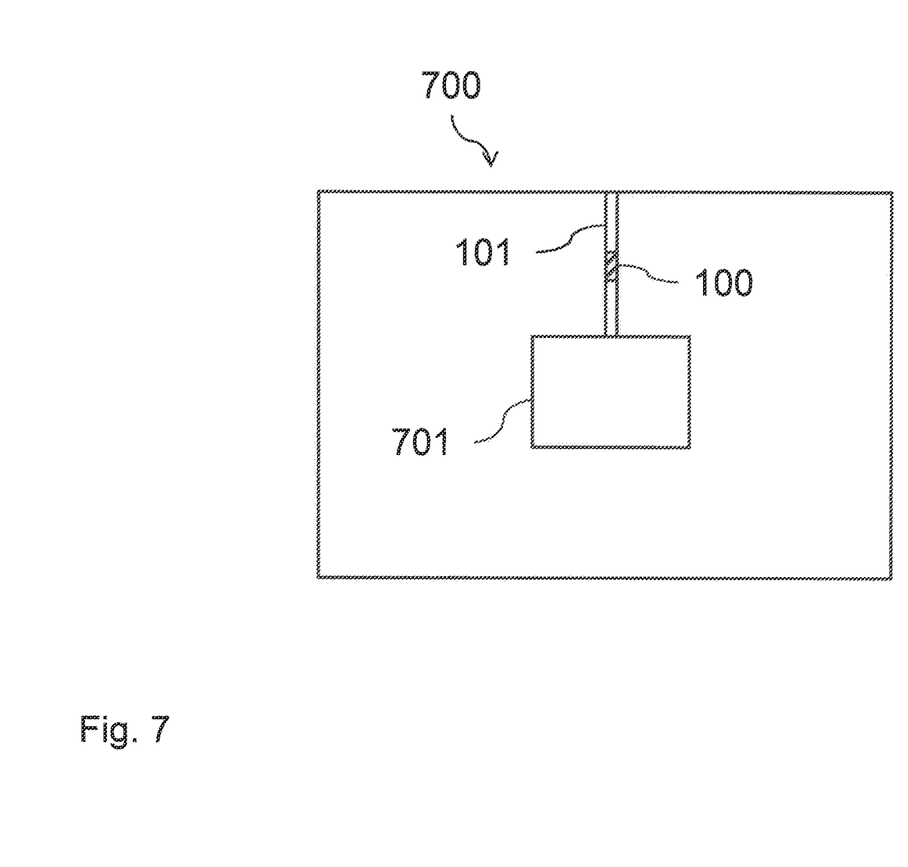
FIG. 7 shows a schematic view of a semiconductor manufacturing device.

FIG. 7 shows a schematic view of a semiconductor manufacturing device 700 according to an embodiment.

The semiconductor manufacturing device 300 comprises a pipe 101 and an apparatus 100 for measuring a fluid flow through the pipe 101. The apparatus 100 in the semiconductor manufacturing device 300 can be the apparatus 100 according to the embodiments of FIG. 1, FIG. 2 or FIG. 3.

The semiconductor manufacturing device 700 can be a bonder, a coater, a mask cleaner or an exposure device.

The semiconductor manufacturing device 700 can comprise a process chamber 701. The pipe 101 can be a discharge line or exhaust duct of the process chamber 701. A semiconductor substrate can be chemically treated in the process chamber 701 giving rise to contaminated fluids, which are discharged from the process chamber through the pipe 101.

A semiconductor manufacturing process in the device 300, for instance a coating process, can be monitored by measuring the fluid flow through the pipe 102.

LIST OF REFERENCES

100 apparatus
101 pipe
103 sealing structure
105 flow structure
107 fluid inlet
109 fluid outlet
111 measuring device
113 first pressure port
115 second pressure port
119 first seal
121 second seal
123 first chamber
125 second chamber
127 opening
129 opening
201a-d tubes
203a-d fluid inlets
205a-d fluid outlets
301 fluid line
303 fluid line
305 control unit
309 flow regulator
311 pressure sensor element
700 semiconductor manufacturing device
701 process chamber

The invention claimed is:

1. An apparatus for measuring a fluid flow through a pipe of a semiconductor manufacturing device comprising:
    a sealing structure which is arranged in the pipe,
    a flow structure having a fluid inlet which is arranged upstream of the sealing structure and a fluid outlet which is arranged downstream of the sealing structure,
    a first chamber which is arranged in the pipe upstream of the sealing structure, and a second chamber which is arranged in the pipe downstream of the sealing structure the first and second chamber being separated from each other by the sealing structure, and
    a measuring device, wherein the measuring device is configured to measure a first fluid pressure in the first chamber and a second fluid pressure in the second chamber, the first chamber and the second chamber being connected to the measuring device via fluid connections and/or pressure connections,
    wherein the measuring device is configured to determine the fluid flow based on the first and second fluid pressure.

2. The apparatus according to claim 1, wherein the flow structure extends within the pipe.

3. The apparatus according to claim 1, wherein the sealing structure is a sealed barrier.

4. The apparatus according to claim 1, wherein the first chamber and/or the second chamber are connected to the sealing structure.

5. The apparatus according to claim 1, wherein the first chamber and the second chamber each have an opening to allow the fluid to flow into the first respectively second chamber.

6. The apparatus according to claim 1, wherein the first chamber and/or the second chamber are conically shaped.

7. The apparatus according to claim 1, wherein the first chamber and/or the second chamber are arranged coaxially to the sealing structure.

8. The apparatus according to claim 1, wherein the measuring device is connected to the first chamber and the second chamber via fluid lines and/or pressure ports or pressure lines, to measure the first and second fluid pressure.

9. The apparatus according to claim 1, wherein the measuring device comprises at least one pressure sensor element configured for measuring the first fluid pressure and the second fluid pressure.

10. The apparatus according to claim 1, wherein the measuring device comprises a processing unit, which is configured to determine the fluid flow based on a pressure difference between the first and second fluid pressure.

11. The apparatus according to claim 1, wherein the apparatus comprises a flow regulator which is arranged within the pipe, wherein the flow regulator is adjustable to control the fluid flow.

12. The apparatus according to claim 11, wherein the measuring device is configured to control the flow regulator based on the determined fluid flow.

13. The apparatus according to claim 11, wherein the flow regulator is a flap or a turbine, which is arranged within the pipe.

14. A semiconductor manufacturing device comprising a pipe and an apparatus for measuring a fluid flow through the pipe according to claim 1.

15. The semiconductor manufacturing device according to claim 14, wherein the pipe is a discharge line for contaminated fluids.

16. The apparatus according to claim 1, wherein the semiconductor manufacturing device is a coater or a bonder.

17. The apparatus according to claim 1, wherein the sealing structure is a plug.

18. An apparatus for measuring a fluid flow through a pipe of a semiconductor manufacturing device comprising:
    a sealing structure which is arranged in the pipe,
    a flow structure having a fluid inlet which is arranged upstream of the sealing structure and a fluid outlet which is arranged downstream of the sealing structure, wherein the flow structure comprises a plurality of tubes , the tubes being formed by through holes in the sealing structure, or wherein the flow structure is at least one separate tube that bypasses the sealing structure,
    a first chamber which is arranged in the pipe upstream of the sealing structure, and a second chamber which is arranged in the pipe downstream of the sealing structure, the first and the second chamber being separated from each other by the sealing structure, and a measuring device, wherein the measuring device is configured to measure a first fluid pressure in the first chamber and a second fluid pressure in the second chamber,
    wherein the measuring device is configured to determine the fluid flow based on the first and second fluid pressure.

19. The apparatus according to claim 18, wherein the flow structure comprises flow straightener tubes.

* * * * *